(12) United States Patent  (10) Patent No.: US 6,413,833 B2
Yamamoto  (45) Date of Patent: *Jul. 2, 2002

(54) METHOD FOR FORMING A CVD SILICON FILM

(75) Inventor: Ichiro Yamamoto, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/239,851

(22) Filed: Jan. 29, 1999

(30) Foreign Application Priority Data

Jan. 30, 1998 (JP) .......................................... 10-019077

(51) Int. Cl.[7] .............................................. H01L 21/20
(52) U.S. Cl. ...................................... 438/398; 438/255
(58) Field of Search ............................... 438/398, 255, 438/253, 396

(56) References Cited

U.S. PATENT DOCUMENTS 5,913,127 A * 6/1999 Dennison et al. ........... 438/398
6,069,053 A * 5/2000 Ping et al. .................. 438/398

FOREIGN PATENT DOCUMENTS

| JP | 3-74842 | 3/1991 |
| JP | 4-45521 | 2/1992 |
| JP | 7-45529 | 2/1995 |
| JP | 7-147246 | 6/1995 |
| JP | 7-335842 | 12/1995 |
| JP | 9-219499 | 8/1997 |
| JP | 9-298284 | 11/1997 |

OTHER PUBLICATIONS

Japanese Office Action dated Jan. 25, 2001, with partial English translation.

* cited by examiner

Primary Examiner—Tuan H. Nguyen
(74) Attorney, Agent, or Firm—McGinn & Gibb, PLLC

(57) ABSTRACT

A method for forming hemispherical grains (HSG) on a cylindrical bottom electrode of a memory capacitor in a memory cell includes the step of introducing phosphine gas before introducing silane gas onto a silicon wafer. The introduction of phosphine gas before introduction of silane gas prevents a lower phosphorous concentration portion in the bottom cylindrical bottom electrode, thereby achieving a suitable HSG structure on the cylindrical bottom electrode.

22 Claims, 8 Drawing Sheets

METHOD FOR FORMING A CVD SILICON FILM

BACKGROUND OF THE INVENTION (a) Field of the Invention

The present invention relates to a method for forming a CVD silicon film on a semiconductor wafer and, more particularly, to a method suitable for use in forming a cylindrical electrode of a memory capacitor in a memory cell of a semiconductor memory device.

(b) Description of the Related Art

Recently, there is a request for increasing the electrostatic capacitance per unit area of the capacitor of a memory cell in a semiconductor memory device such as DRAM (Dynamic Random Access Memory). Either a top electrode or a bottom electrode, for instance a bottom electrode, is formed of a cylindrical shape to meet the request for the increase of the capacitance. In addition, it is also attempted to form a hemispherical grained silicon (HSG-Si) structure on the cylindrical electrode for further increasing the surface area of the cylindrical electrode.

Patent Publication JP-A-9-167833 proposes a first conventional process for forming the HSG-Si structure on the electrode surface. The proposed process includes the step of forming seeds for the HSG-Si on the surface of the cylindrical bottom electrode by a low-pressure chemical vapor deposition (LPCVD) process, followed by selective ion etching using the seeds as a mask to enlarge the roughness of the HSG-Si on the surface, thereby increasing the surface area of the cylindrical bottom electrode. The etching process is conducted while changing the incident angle of the etching gas, which involves a complicated process.

A second conventional process is also known which may replace the complicated first conventional process. The second conventional process includes the step of introducing silane gas (including disilane gas) into a HSG reactor receiving therein semiconductor wafers having bottom electrodes, followed by a heat treatment at a predetermined temperature, thereby forming HSG-Si structure on the bottom electrode.

Although the second conventional process has an advantage of simplified process, the bottom electrode manufactured by the second conventional process has larger surfaces of the HSG (grains) on the outer surface of the bottom electrode compared to the inner surface thereof. The larger surfaces of the HSG do not effectively increase the surface area of the bottom electrode due to the contact between the surfaces of the HSG.

SUMMARY OF THE INVENTION

It is therefore an object of the present invention to provide a method for forming a CVD silicon film which can be formed as a cylindrical electrode having a suitable HSG-Si structure, which is capable of increasing the capacitance of the memory cell capacitor.

The present invention provides a method for manufacturing a semiconductor device comprising the steps of consecutively introducing phosphine gas and silane gas onto a surface of a semiconductor wafer to deposit a CVD silicon film thereon, and heat treating the CVD silicon film. Instead of consecutively introducing phosphine gas and silane gas, a mixture of phosphine gas and silane gas may be introduced.

The present invention also provides a method for manufacturing a semiconductor device comprising the steps of forming a first insulator film having an electrode hole therein, depositing an amorphous silicon film on the first insulator film including inside the electrode hole, forming a second insulator film on the amorphous silicon film, etching back the first insulator film and the amorphous silicon film and wet-etching the first insulator film and the second insulator film to leave a cylindrical electrode film made from the amorphous silicon film, removing an outer surface portion of the cylindrical electrode film by a specified amount, heat treating the cylindrical electrode film to form hemispherical grains thereon, and forming a capacitor including the cylindrical electrode and another electrode film.

In accordance with the present invention, the CVD silicon film or the cylindrical electrode film has a uniform phosphorous concentration, which provides a uniform grain size for the hemispherical grains formed on the CVD silicon film or the cylindrical electrode film to achieve a larger surface area of the CVD silicon film or the cylindrical electrode film. Thus, a large capacitance can be obtained from the HSG-Si structure.

PREFERRED EMBODIMENTS OF THE INVENTION

Before describing preferred embodiments of the present invention, the cause of the larger surface of the hemispherical grains formed in the conventional method will be described first for a better understanding of the present invention.

Figure 1A:
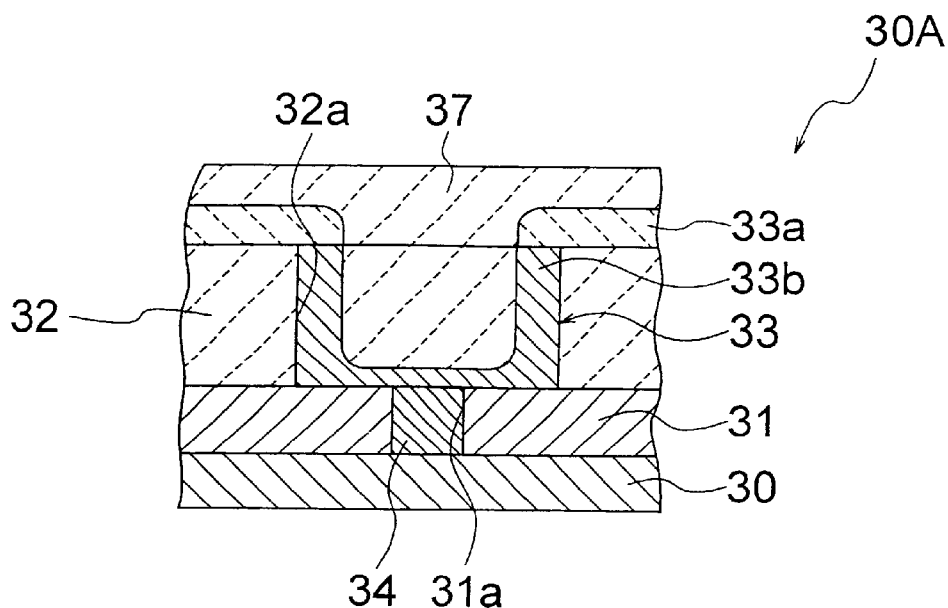
FIGS. 1A and 1B are sectional views of a bottom electrode of a capacitor in consecutive steps of a conventional process.
Figure 1B:
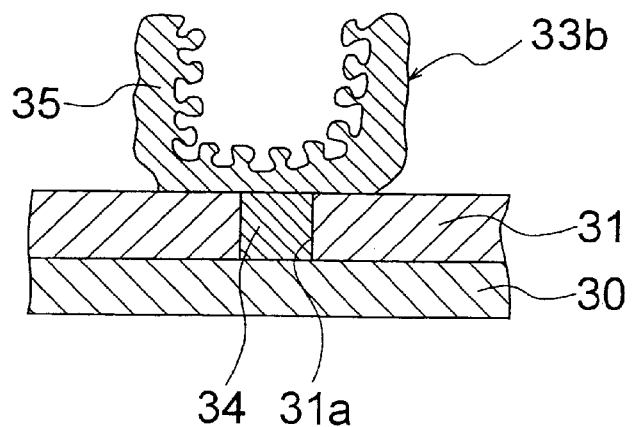

Referring to FIGS. 1A and 1B, there is shown a bottom electrode of a capacitor manufactured in the conventional process. The bottom electrode is fabricated as follows. First, an insulator layer 31 is formed on a silicon substrate 30, followed by forming a through-hole 31a therein to expose a portion of the silicon substrate 30. Subsequently, an amorphous silicon (a-Si) film doped with impurity ions is formed on the entire surface to fill the through-hole 31a with the a-Si film 34, followed by etch-back thereof to leave the a-Si film 34 in the through-hole 31a. Thereafter, an oxide film 32 is formed on the insulator film 31, followed by a selective etching thereof to form an electrode hole 32a for later receiving therein an electrode.

Figure 2:
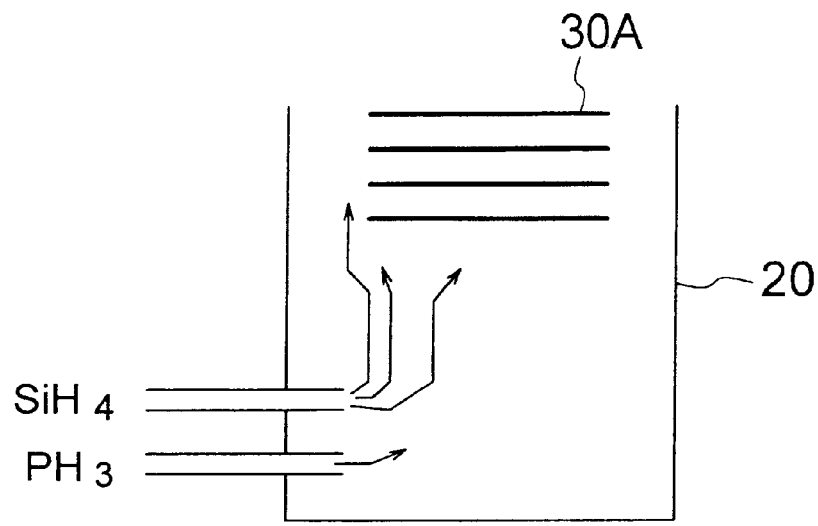
FIG. 2 is a schematic sectional view of a deposition chamber used in the conventional process.

Referring to FIG. 2, there is shown a deposition chamber used for receiving therein the semiconductor wafer 30A of FIG. 1A. The semiconductor wafer 30A having the electrode hole 32a therein is received in the deposition chamber 20, and subjected to a heat treatment at a specified temperature while introducing silane gas ($SiH_4$) and phosphine gas ($PH_3$), to form a CVD film 33 made of amorphous silicon in the electrode hole 32a. In this text, the term "silane gas" includes disilane gas as well as silane gas. In this step, the CVD silicon film 33 starts for the deposition in the vicinity of the wall of the electrode hole 32a and then the deposition advances toward the center of the electrode hole 32a. After a specified thickness of the CVD silicon film 33 is obtained by the deposition, a CVD oxide film 37 is formed on the CVD silicon film 33, followed by etch-back of the CVD oxide film 37 and the top portion 33a of the CVD silicon film 33 down to the top of the electrode hole 32a. Another etching using a wet etching is then performed to form a cylindrical bottom electrode 33b.

Figure 3:
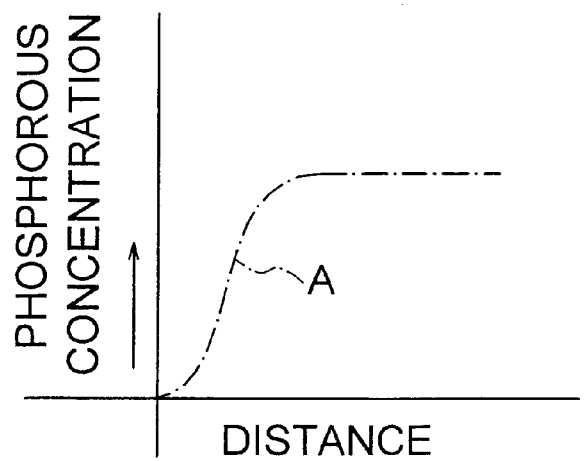
FIG. 3 is a profile of phosphorous concentration of the a-Si layer of FIG. 1 vs distance from the underlying layer.

FIG. 3 shows a phosphorous concentration profile of the cylindrical bottom electrode plotted against the distance measured from the underlying layer. At the start of the deposition of the amorphous silicon after introduction of the gases in FIG. 2, phosphine gas is generally slow to reach the surface of the silicon wafer 30A compared to the silane gas, whereby only a sufficient amount of silane gas reaches the semiconductor wafer 30 at the initial stage of the deposition. This causes a lower phosphorous concentration in the cylindrical bottom electrode, as shown by the portion "A" of the profile of FIG. 3, in the vicinity of the outer surface of the cylindrical bottom electrode 33b.

It was found by the inventors that the lower phosphorous concentration of the bottom electrode in the vicinity of the outer surface thereof involves a larger grain size of the HSG-Si whereas the higher phosphorous concentration in the vicinity of the inner surface provides a smaller grain size of the HSG-Si, thereby generating the difference in the shape of the HSG-Si between the outer surface and the inner surface of the cylindrical bottom electrode formed by the conventional process.

In view of the above findings, in a preferred embodiment of the present invention, only phosphine gas is first introduced in the deposition chamber before the deposition of the amorphous silicon. The phosphine gas alone does not initiate the deposition of silicon, which starts at the instant when both the phosphine gas and the silane gas are introduced in the deposition chamber and reach the surface of the semiconductor wafer 30A. The deposition thus started provides a suitable phosphorous concentration of the cylindrical bottom electrode, which in turn prevents the larger grain size of the HSG-Si on the outer surface of the cylindrical bottom electrode.

The timing of the introduction of the phosphine gas may be controlled instead of introduction of the same beforehand, to control the phosphorous concentration of the bottom electrode, thereby simplifying the process.

In a further preferred embodiment, after the amorphous film having a suitable phosphorous concentration is formed by a CVD process, an oxide film is formed thereon. The CVD amorphous film and the oxide film are etched-back, followed by a wet etching of the oxide film to leave a cylindrical bottom electrode. The semiconductor wafer including the cylindrical bottom electrode is introduced into a deposition chamber and subjected to a heat treatment in a silane gas ambient at a specified temperature, followed by another heat treatment in a vacuum ambient at the specified temperature to form the HSG-Si structure on the surface of the cylindrical bottom electrode. The specified temperature is preferably between 540° C. and 630° C.

The silane gas may be mixed with the phosphine gas before introduction onto the semiconductor wafer. In an alternative of the above configuration, a CVD amorphous film may have a lower phosphorous concentration at the surface of the amorphous silicon film. In this case, a surface portion of the amorphous silicon film is removed by etching at the outer surface of the cylindrical bottom electrode before forming the HSG-Si structure thereon. The surface portion of the amorphous silicon film thus removed may have a thickness of 50 to 200 angstroms. The etching may be an isometric etching using a wet etching. The wet etching may use a mixture of ammonia and hydrogen peroxide.

Figure 4A:
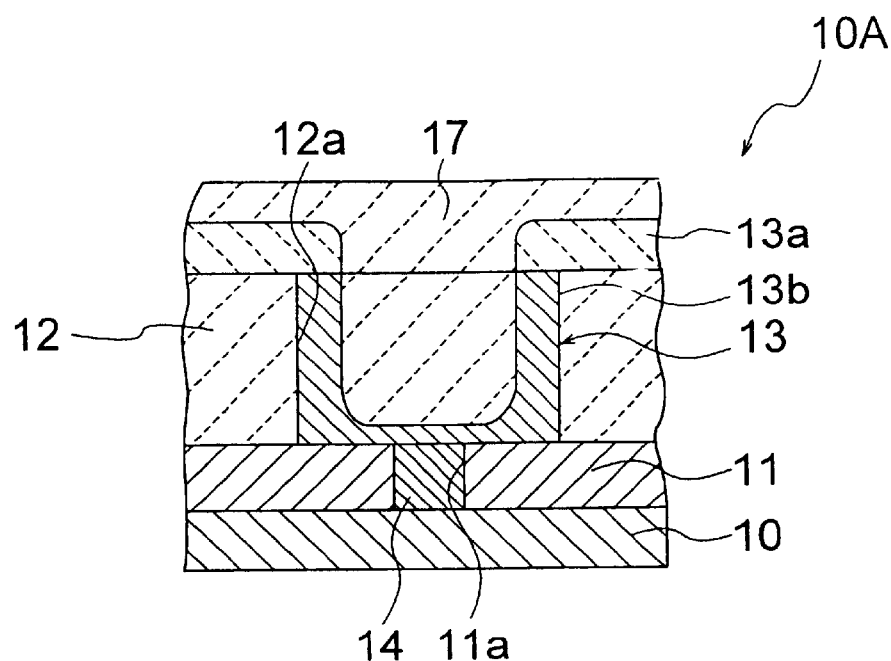
FIGS. 4A and 4B are sectional views of a bottom electrode of a capacitor in consecutive steps of a process according to a first embodiment of the present invention.

Now specific preferred embodiments of the present invention will be described with reference to the accompanying drawings. Referring to FIG. 4A, an insulator film made of $SiO_2$ is first formed on a silicon substrate 10, followed by a photolithographic step to form a through-hole 11a in the insulator film 11 to expose a portion of the silicon substrate 10. Subsequently, an amorphous silicon film (or a polycrystalline silicon film) is deposited on an entire surface to fill the through-hole 11a, followed by an etch-back thereof to leave the amorphous silicon film 14 in the through-hole 11a.

Thereafter, a silicon oxide ($SiO_2$) film 12 is formed on the insulator film 11, followed by etching thereof to form an electrode hole 12a for later receiving therein a bottom electrode. The semiconductor wafer 10A thus manufactured is then introduced into a deposition chamber to be subjected to a heat treatment in a mixed gas ambient at a specified temperature to form a CVD amorphous silicon film 13. After the CVD amorphous silicon film 13 thus formed has a specified film thickness, a CVD oxide film 17 is formed thereon to fill the central hole of the CVD amorphous silicon film 13 with the CVD oxide film 17, as shown in FIG. 4A. Thereafter, the CVD oxide film 17 and the top portion 13a of the CVD amorphous silicon film 13 are subjected to an etch-back step to leave the CVD oxide film 17 and the CVD amorphous silicon film 13b in the electrode hole 12a. Subsequently, a wet etching is performed to remove the remaining CVD oxide film 17 and the insulator film 12 surrounding the remaining amorphous silicon film 13b, thereby leaving a cylindrical amorphous silicon film 13b.

The CVD process for depositing the amorphous silicon film 13 is shown in FIGS. 5A to 5D. The deposition chamber 20 for forming the CVD amorphous silicon film is equipped with a plurality of cylindrical containers each receiving therein nitrogen gas, phosphine gas or silane gas. The silane gas is introduced through a tube 22a to the deposition chamber 20, whereas the phosphine gas is introduced through tubes 23a and 24a to the deposition chamber 20. A selector valve 25, 26 or 27 is provided to each of the tubes 22a, 23a and 24a for introducing corresponding gas to the deposition chamber 20 either directly or indirectly by way of a rear tube 19, which is also used for evacuation of the deposition chamber 20.

Figure 5A:
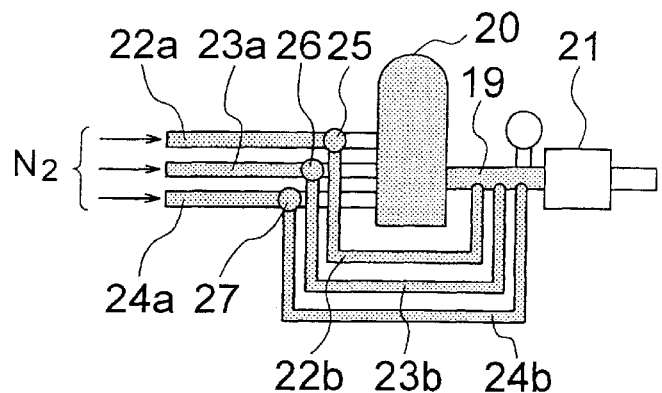
FIGS. 5A to 5D are schematic sectional views of a deposition chamber used in the first embodiment.

In the step of FIG. 5A, the semiconductor wafer having thereon the electrode hole 12a is introduced into the deposition chamber 20, which is then evacuated to a vacuum by using a pump 21 and the tube 19. The selector valves 25, 26 and 27 are switched to couple the tubes 22a, 23a and 24a with the tube 29, thereby introducing nitrogen gas into the deposition chamber 20 by way of tube 29 to fill the deposition chamber 20 with nitrogen gas.

Figure 5B:
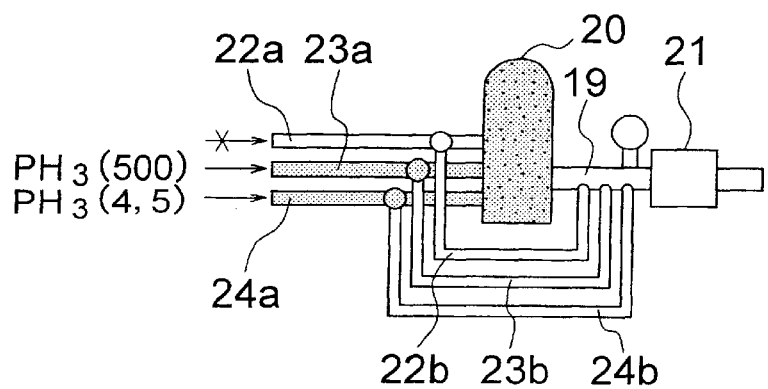

The introduction of nitrogen gas is then stopped, followed by purging the tubes 22a, 23a and 24a and the selector valve 25 is closed whereas the selector valves 26 and 27 are switched to couple the tubes 23a and 24a with the deposition chamber 20. At this state, phosphine gas is introduced into the deposition chamber by way of the tube 23a at a flow rate of 500 sccm (standard cubic centimeters per minute), and by way of the tube 24a at 4.5 sccm, as shown in FIG. 5B.

Figure 5C:
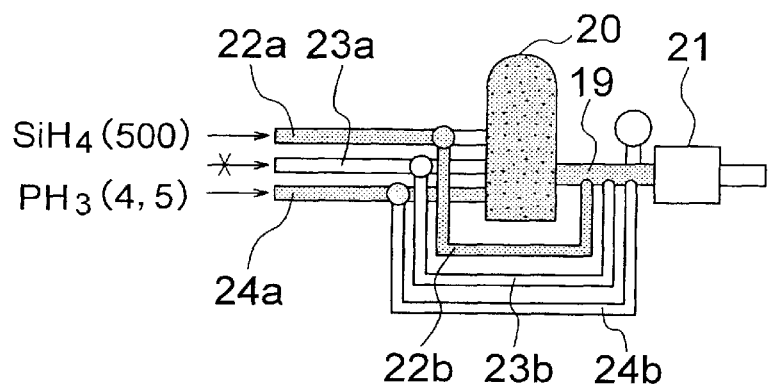
Figure 5D:
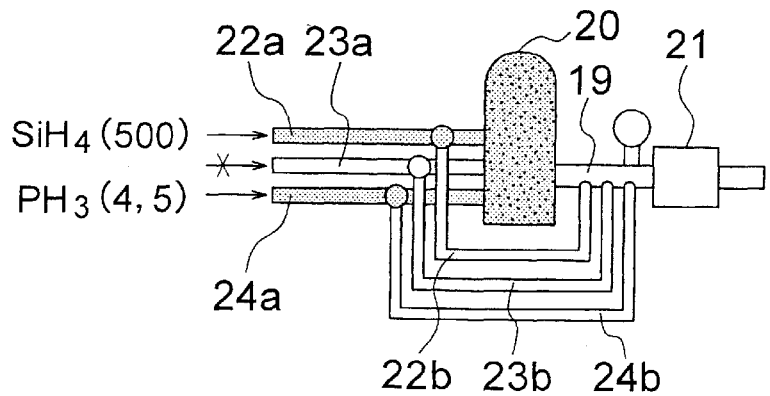

Subsequently, the selector valve 26 is closed for stopping the introduction of phosphine gas by way of the tube 23a, while continuing the introduction of phosphine gas by way of the tube 24a at 4.5 sccm. Then, the selector valve 25 is switched to couple the tube 22a with the tube 22b, thereby introducing silane gas into the tubes 22b and 19 for purging the tubes by using the pump 21, as shown in FIG. 5C.

Thereafter, the tube 23a is stopped by selector valve 26, and the selector valve 25 is switched to introduce silane gas into the deposition chamber 20 while continuing the introduction of phosphine gas into the deposition chamber 20. Since the deposition chamber 20 receives therein a sufficient amount of phosphine gas at this stage, CVD of doped amorphous silicon can be started at the instant when the silane gas reaches the surface of the silicon wafer. The CVD can achieve a constant phosphorous concentration of the amorphous silicon along the thickness and surface directions of the amorphous silicon film 13. The introduction of phosphine gas by way of two tubes 23a and 24a at a large flow rate and a moderate flow rate can provide a stable flow rate of the phosphine gas with respect to time.

Back to FIG. 4A, a CVD oxide film 17 is then formed on the CVD amorphous silicon film 13, followed by etch-back of the CVD oxide film 17 and the top portion 13a of the CVD amorphous silicon film 13, to leave both the films 13b and 17 in the electrode hole 12a. The remaining CVD oxide film 17 and the oxide film 12 surrounding the CVD amorphous silicon film 13b are then subjected to a wet etching for removal thereof, thereby leaving a cylindrical bottom electrode 13b on the insulator film 11.

Figure 4B:
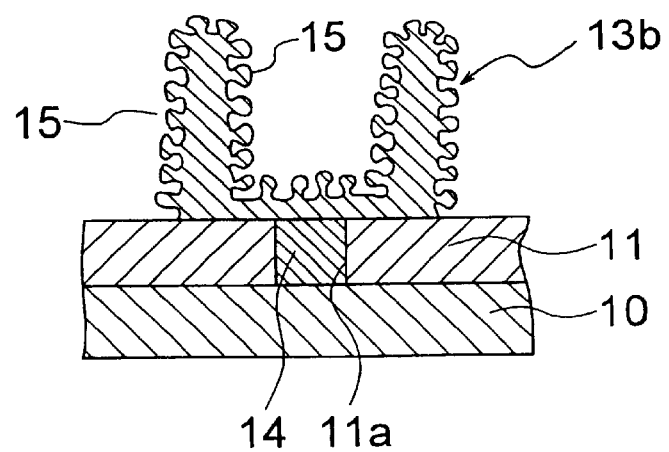

The cylindrical bottom electrode 13b is then subjected to the step of forming hemispherical grains on the surface of the cylindrical amorphous film 13b, as follows. First, the semiconductor wafer 10A is introduced into a HSG chamber, wherein the semiconductor wafer is subjected to a heat treatment in a silane gas ambient at a temperature between about 540° C. and about 630° C. Then, the silane gas is stopped, and the HSG chamber is evacuated by a pump to a vacuum, wherein the semiconductor wafer is subjected to a heat treatment at a temperature between about 540° C. and about 630° C. As a result, the cylindrical bottom electrode has hemispherical grains on the inner and outer surfaces thereof, as shown in FIG. 4B, wherein the size and the number of the grains are substantially constant over the entire surface of the cylindrical bottom electrode 13b. The number of grains per unit area substantially depends on the time length for introduction of silane gas, whereas the size of the grains substantially depends on the time length for the heat treatment after stopping the introduction of the silane gas.

Figure 6A:
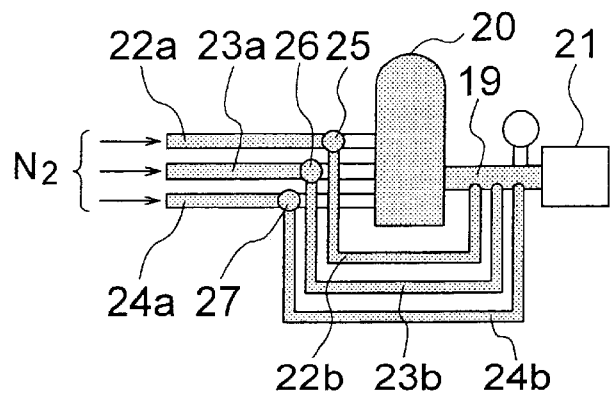
FIGS. 6A to 6D are schematic sectional views of a deposition chamber used in a second embodiment of the present invention.

FIGS. 6A to 6D show consecutive steps of a process according to a second embodiment of the present invention. In the step of FIG. 6A, the semiconductor wafer having the electrode hole is introduced into the deposition chamber 20. After the deposition chamber 20 is evacuated to a vacuum by the pump 21, the sector valves 25, 26 and 27 are switched to couple the tubes 22a, 23a and 24a with the tube 19. As a result, nitrogen gas is introduced to the deposition chamber through the tubes 22b, 23b and 24b and through the tube 29, thereby filling the deposition chamber 20 with nitrogen gas.

Figure 6B:
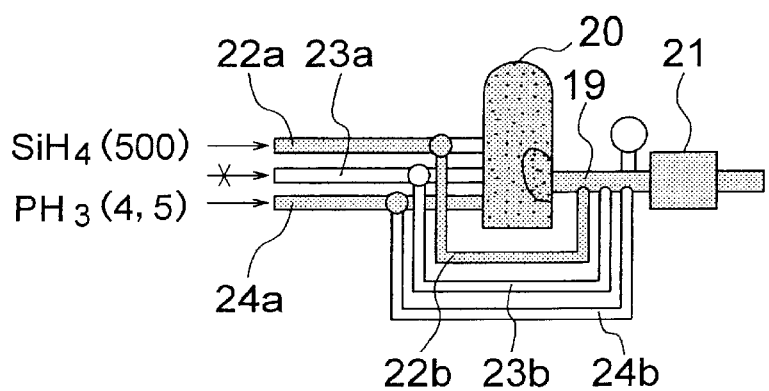

Subsequently, nitrogen gas is stopped, followed by purging the tubes 22a, 23a and 24a. By closing the selector valve 26 and switching the selector valves 25 and 27, silane gas is introduced through the tubes 22a and 22b at 500 sccm toward the pump 21 for purging, and at the same time phosphine gas is introduced through the tube 24a at 4.5 sccm into the deposition chamber 20 filled with the nitrogen gas, as shown in FIG. 6B.

Figure 6C:
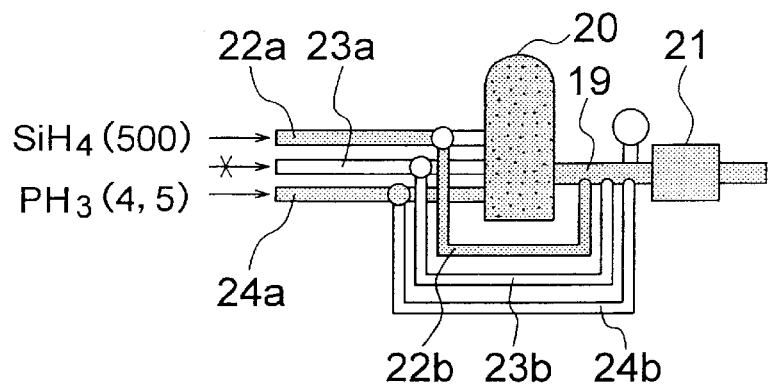
Figure 6D:
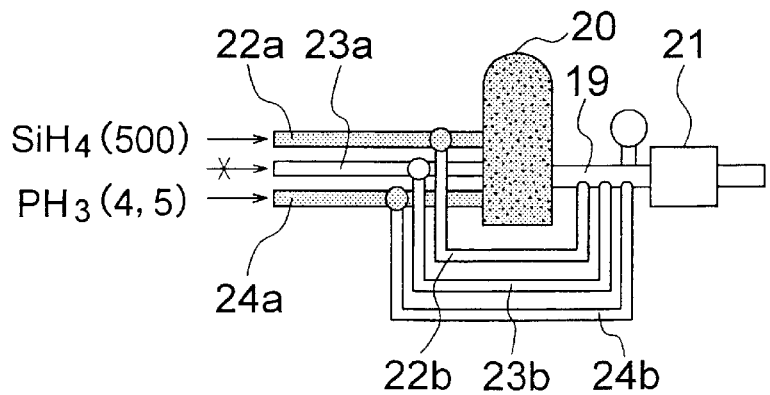

The purging by the silane gas and introduction of phosphine gas are continued in the step of FIG. 6C, whereby the nitrogen gas is gradually replaced by the phosphine gas in the deposition chamber 20.

Thereafter, while the tube 23a is stopped and introducing phosphine gas into the deposition chamber 20 through the tube 24a at a slow rate, the selector valve 25 is switched to couple 22a with the deposition chamber 20, whereby silane gas is introduced to the deposition chamber 20 instead of purging. Since phosphine gas is already introduced into the deposition chamber 20 at this stage, the introduction of the silane gas onto the surface of the semiconductor wafer starts deposition of a doped amorphous silicon film on the semiconductor wafer. This provides a uniform phosphorous concentration in the resultant cylindrical bottom electrode.

Further, a HSG-Si structure is formed on the CVD amorphous silicon film by steps similar to the steps described for is the first embodiment.

Figure 7:
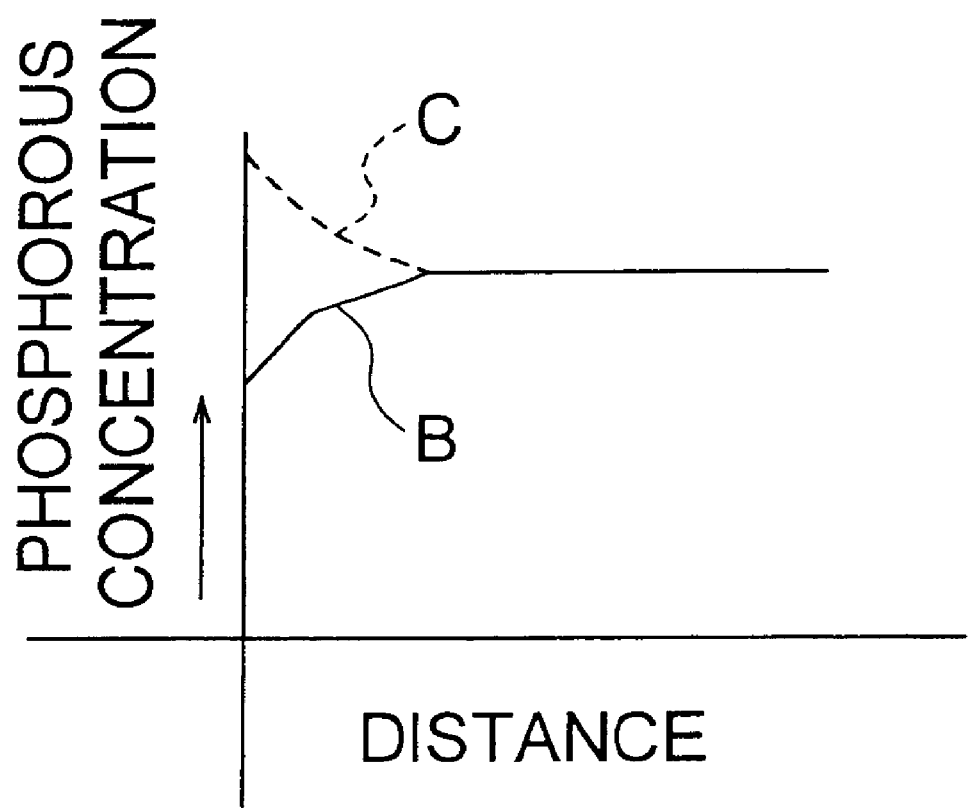
FIG. 7 is a profile of phosphorous concentration of the a-Si layer of FIGS. 4A and 4B vs distance from the underlying layer.

FIG. 7 shows a profile of the phosphorous concentration in the CVD amorphous silicon film formed by the second embodiment. In the second embodiment, a single tube 24a used for introduction of phosphine gas into the deposition chamber 20 allows fine adjustment of the phosphine concentration in the deposition chamber at the instant when the silane gas reaches the surface of the semiconductor wafer. For example, the time length for introduction of the phosphine gas is controlled before the introduction of the silane gas, while the flow rates of the silane gas and the phosphine gas are maintained at constants in the tubes 22a, 23a and 24a. This allows the phosphorous concentration profile to be controlled between the dotted curve C and the solid line B in FIG. 7 at the initial stage of deposition.

Although the time length for the deposition is longer in the second embodiment compared to the first embodiment, the second embodiment can provide a more suitable profile of the phosphorous concentration at the initial stage of the deposition.

Figure 8A:
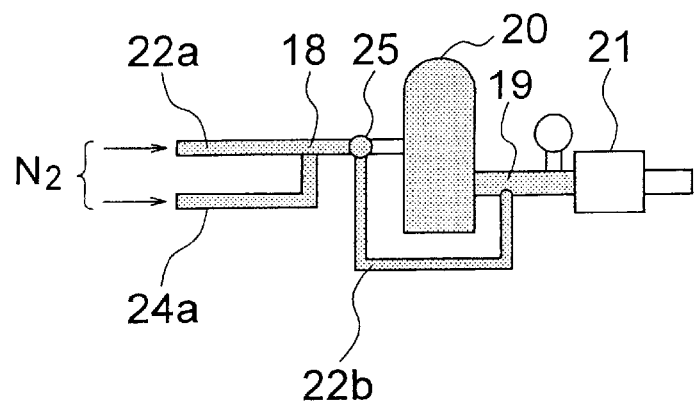
FIGS. 8A to 8C are schematic sectional views of a deposition chamber used in a third embodiment of the present invention.
Figure 8B:
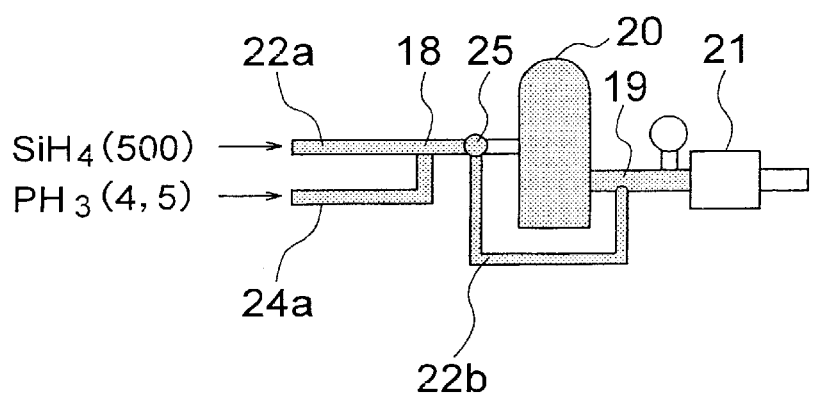
Figure 8C:
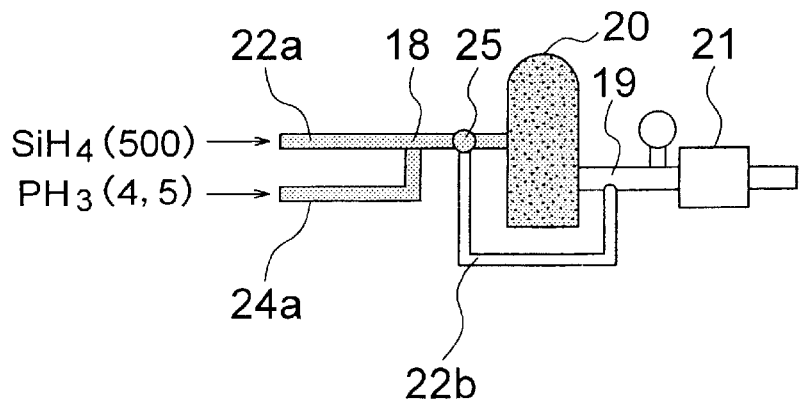

Referring to FIGS. 8A to 8C showing consecutive steps of a process according to a third embodiment of the present invention, the tube arrangement is such that the tube 22a connected to the container for nitrogen gas or the container for silane gas and the tube 24a connected to the container for nitrogen gas or the container for phosphine gas are coupled together to a common tube 18, which is directly coupled to the deposition chamber 20 or coupled by way of tubes 22b and 19 to the deposition chamber 20 by switching of the selector valve 25. The tube 19 is used as an exhaust tube associated with the pump 21.

The semiconductor wafer having the electrode hole is introduced into the deposition chamber 20, which is then evacuated by the pump 21 to a vacuum. After stopping the pump 21, selector valve 25 is switched to couple the common tube 18 with the tube 19, whereby nitrogen gas is introduced through the tube 19 to the deposition chamber 20 to fill the deposition chamber with nitrogen gas, as shown in FIG. 8A.

Subsequently, nitrogen gas is stopped, followed by introduction of silane gas through the tube 22a at 500 sccm and phosphine gas through the tube 24a. Then, the selector valve 25 is switched to couple the tube 18 with the tube 22b and the pump 21 is started, whereby the mixed gas is used for purging the tubes 22b and 19, as shown in FIG. 8B. Thereafter, the selector valve 25 is switched to couple the common tube 18 with the deposition chamber 20 and the pump 21 is stopped, whereby the mixed gas is introduced into the deposition chamber 20, as shown in FIG. 8C. The mixed gas starts deposition of a CVD amorphous silicon film having a uniform phosphorous concentration.

Figure 9A:
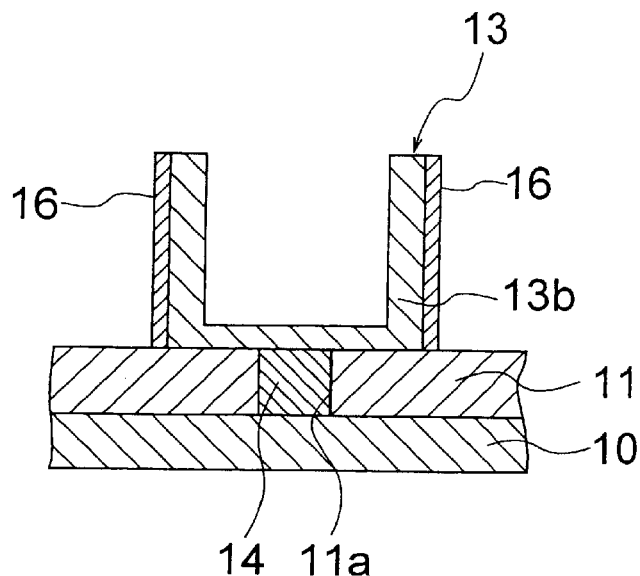
FIGS. 9A to 9C are sectional views of a bottom electrode of a capacitor in consecutive steps of a process according to a fourth embodiment of the present invention.
Figure 9B:
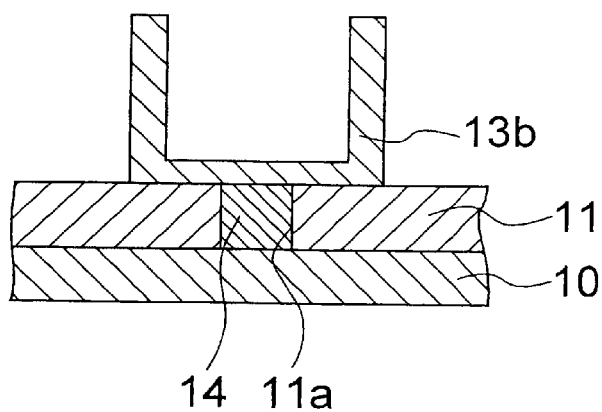
Figure 9C:
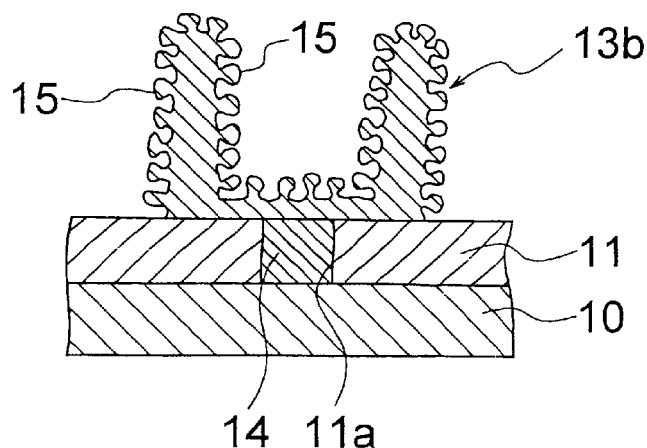

Referring to FIGS. 9A to 9C, there is shown a cylindrical bottom electrode in consecutive steps of a fabrication process according to a fourth embodiment. First, a cylindrical electrode film 13 is formed on an insulator film 11 by using a conventional CVD process. The cylindrical electrode film 13 thus fabricated has an outer portion 16 having a lower phosphorous concentration, as shown in FIG. 9A. The cylindrical electrode film 13 is subjected to an isotropic wet etching using a mixture of ammonia and hydrogen peroxide. The outer portion 16 having a lower phosphorous concentration has a thickness of about 50 to about 100 angstroms, for example, whereas the remaining portion 13b of the cylindrical bottom electrode 13 has a substantially uniform and sufficient phosphorous concentration. The wet etching has an etch rate of about 1 to about 3 angstroms per minute, for example. Thus, a time length of 30 to 60 minutes for the wet etching can remove a thickness of about 50 to about 200 angstroms of the silicon, whereby the remaining amorphous silicon film 13b has a uniform phosphorous concentration.

The wet etching may use a mixture of hydrofluoric acid and hydrogen peroxide or a mixture of hydrofluoric acid and nitric acid instead of the mixture of ammonia and hydrogen peroxide.

After the wet etching, the cylindrical bottom electrode is subjected to the step of forming hemispherical grains on the cylindrical bottom electrode 13b, similarly to the first and second embodiments.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a semiconductor device comprising:
    depositing a CVD silicon film having a substantially uniform phosphorous concentration on a semiconductor wafer, said depositing comprising:
        introducing phosphine gas via a first tube and a second tube to a deposition chamber containing said semiconductor wafer; and
        reducing a flow rate of said phosphine gas via said first tube, and while introducing said phosphine gas at a reduced flow rate, introducing silane gas to said chamber; and
    heat treating said CVD silicon film
    wherein said phosphorous concentration is controlled by selectively varying a flow rate of said phosphine gas.

2. The method as defined in claim 1, wherein said depositing further comprises selectively controlling a time length for introducing said phosphine gas before introducing said silane gas.

3. The method as defined in claim 1, wherein said heat treating is conducted at a temperature between 540 and 630° C.

4. The method as defined in claim 3, wherein said heat treating comprises heat treating in a silane gas ambient followed by heat treating in a vacuum ambient.

5. The method as defined in claim 1, wherein said CVD silicon film has a cylindrical shape.

6. The method as defined in claim 5, wherein said CVD silicon film is used as a bottom electrode of a capacitor in a memory cell.

7. The method as defined in claim 1, wherein said heat treating forms a plurality of hemispherical grains on a surface of said CVD silicon film.

8. The method as defined in claim 7, wherein said hemispherical grains have a uniform size.

9. The method as defined in claim 1, wherein said silane gas comprises disilane gas.

10. The method as defined in claim 1, wherein said CVD silicon film is amorphous.

11. The method as defined in claim 1, wherein said depositing a CVD silicon film is carried out at a specified temperature.

12. A method for manufacturing a semiconductor device comprising:
    depositing a CVD silicon film having a substantially uniform phosphorous concentration on a semiconductor wafer, said depositing comprising:
        introducing phosphine gas to a deposition chamber containing said semiconductor wafer; and
        after introducing said phosphine gas for a predetermined time period, introducing silane gas and phosphine gas to said chamber; and
    heat treating said CVD silicon film,
    wherein said phosphorous concentration is controlled by selectively varying said predetermined time period
    mixing phosphine gas and silane gas to generate a mixed gas; and
    introducing said mixed gas onto a surface of a silicon wafer to form a CVD silicon film having a substantially uniform phosphorous concentration thereon.

13. The method as defined in claim 12, wherein said heat treating forms hemispherical grained silicon on a surface of said CVD silicon film.

14. The method as defined in claim 12, wherein said heat treating is conducted at a temperature between 540 and 630° C.

15. The method as defined in claim 12, wherein said CVD silicon film has a cylindrical shape.

16. The method as defined in claim 12, wherein introducing said phosphine gas and said silane gas is carried out at a specified temperature.

17. The method as defined in claim 12, wherein said silane gas comprises disilane gas.

18. A method for manufacturing a semiconductor device comprising:
    forming a first insulator film having an electrode hole therein;
    using phosphine gas and silane gas to deposit an amorphous silicon film on said first insulator film including inside said electrode hole;
    forming a second insulator film on said amorphous silicon film;
    etching back said first insulator film and said amorphous silicon film and wet-etching said first insulator film and said second insulator film to leave a cylindrical electrode film made from said amorphous silicon film;

removing an outer surface portion of said cylindrical electrode film by a specified amount;

heat treating said cylindrical electrode film to form hemispherical grains thereon; and forming a capacitor including said cylindrical electrode and another electrode film.

19. The method as defined in claim 18, wherein said removing comprises isometric etching.

20. The method as defined in claim 18, wherein said outer surface portion has a lower phosphorous concentration compared to a remaining portion of said cylindrical electrode film.

21. The method as defined in claim 18, wherein said removing comprises a wet etching using one of a mixture of ammonia and hydrogen peroxide, a mixture of hydrofluoric acid and hydrogen peroxide, and a mixture of hydrofluoric acid and nitric acid.

22. A method for manufacturing a semiconductor device comprising:

forming a first insulator film having an electrode hole therein;

depositing an amorphous silicon film on said first insulator film including inside said electrode hole;

forming a second insulator film on said amorphous silicon film;

etching back said second insulator film and said amorphous silicon film and wet-etching said first insulator film and said second insulator film to leave a cylindrical electrode film made from said amorphous silicon film;

removing about 50 to about 200 angstroms of an outer surface portion of said cylindrical electrode film;

heat treating said cylindrical electrode film to form hemispherical grains thereon; and forming a capacitor including said cylindrical electrode and another electrode film.

* * * * *